United States Patent
Master et al.

(10) Patent No.: US 7,753,766 B2
(45) Date of Patent: Jul. 13, 2010

(54) APPARATUS AND METHOD FOR COOLING A SPACE IN A DATA CENTER BY MEANS OF RECIRCULATION AIR

(75) Inventors: Pedro Master, Hoogland (NL); Marcel van Dijk, Spijkenisse (NL); Robbert Mees Lodder, Den Hoorn (NL); Wolter Schaap, Voorst (NL)

(73) Assignee: KyotoCooling International B.V., Schiedam (NL)

( * ) Notice: Subject to any disclaimer, the term of this patent is extended or adjusted under 35 U.S.C. 154(b) by 0 days.

(21) Appl. No.: 12/124,697

(22) Filed: May 21, 2008

(65) Prior Publication Data

US 2009/0073652 A1 Mar. 19, 2009

Related U.S. Application Data

(63) Continuation of application No. PCT/NL2007/050435, filed on Sep. 6, 2007.

(30) Foreign Application Priority Data

Sep. 8, 2006 (NL) .................................. 1032450

(51) Int. Cl.
*H05K 7/20* (2006.01)
*F24F 13/30* (2006.01)
*F28D 19/04* (2006.01)

(52) U.S. Cl. ...................... 454/184; 361/691; 361/696; 165/8

(58) Field of Classification Search ................. 454/184, 454/186; 361/691, 696; 165/8
See application file for complete search history.

(56) References Cited

U.S. PATENT DOCUMENTS

| | | | | |
|---|---|---|---|---|
| 3,965,695 A | * | 6/1976 | Rush et al. | 62/271 |
| 4,426,853 A | * | 1/1984 | Mitani et al. | 62/235.1 |
| 5,003,961 A | * | 4/1991 | Besik | 126/110 R |
| 5,238,052 A | | 8/1993 | Chagnot | |
| 5,579,647 A | * | 12/1996 | Calton et al. | 62/94 |
| 5,649,428 A | | 7/1997 | Calton et al. | |
| 6,004,384 A | | 12/1999 | Caudle | |
| 6,141,979 A | * | 11/2000 | Dunlap | 62/176.6 |
| 6,361,585 B1 | | 3/2002 | Anzai et al. | |
| 6,684,653 B2 | | 2/2004 | Des Champs | |
| 6,868,683 B2 | * | 3/2005 | Bash et al. | 62/180 |
| 2003/0050003 A1 | | 3/2003 | Charron | |
| 2007/0079623 A1 | * | 4/2007 | Inaba et al. | 62/260 |
| 2007/0125110 A1 | * | 6/2007 | Gudmundsson et al. | 62/259.2 |

FOREIGN PATENT DOCUMENTS

WO  WO 9218821 A1 * 10/1992
WO  WO 03/073012    9/2003

* cited by examiner

*Primary Examiner*—Steven B McAllister
*Assistant Examiner*—Patrick F. O'Reilly, III
(74) *Attorney, Agent, or Firm*—Swanson & Bratschun, L.L.C.

(57) ABSTRACT

A data center comprising an air humidity- and temperature-conditioned space where heat producing ICT and/or telecom equipment is arranged, a heat wheel and means for supplying recirculation of air heated by the equipment as a first air stream to the heat wheel and the heat wheel being configured to cool the first air stream using a separate second air stream.

33 Claims, 2 Drawing Sheets

APPARATUS AND METHOD FOR COOLING A SPACE IN A DATA CENTER BY MEANS OF RECIRCULATION AIR

RELATED APPLICATIONS

This application is a continuation application of PCT/NL2007/050435, filed on Sep. 6, 2007, entitled "Apparatus and Method for Cooling a Space in a Data Center by Means of Recirculation Air", which application claims the benefit of Netherlands Application Serial No. NL 1032450, filed Sep. 6, 2006, each of which is incorporated herein by reference in its entirety.

TECHNICAL FIELD

The invention relates to an apparatus and method for cooling a space in a data center using recirculation air, which space is air humidity- and temperature-conditioned and in which ICT and/or telecom equipment is arranged.

BACKGROUND

Data centers are generally known and usually comprise at least one space in which ICT and/or telecom equipment is arranged, such as computer, server or network equipment. For a proper operation of the equipment, a proper and stable temperature and air humidity in the space are important. A proper operating temperature for the equipment is between about 20° C. and about 25° C. and a proper air humidity is between about 45% and about 55%. In view of the heat production of the ICT and/or telecom equipment, it is desirable to cool the space in order to keep the space at a stable temperature and air humidity. A data center is usually in operation 24 hours a day, seven days a week, and so the ICT and/or telecom equipment should be cooled practically continuously. The conditioned spaces in data centers are accessible to persons, and for that purpose are ventilated.

To cool the space, it is usually provided with a raised floor under which a cold air stream is blown. Via apertures in the floor, the air stream is blown into the space. At the top of the space, the heated air stream is extracted and, after cooling, the cooled air stream is again blown under the raised floor. Thus, the air stream is recirculated in the space.

The air stream is cooled by means of a cooling unit, usually a compression cooling unit in which a refrigerant is compressed. The heated air stream gives off its heat to the refrigerant or to a cooling liquid functioning as intermediate medium. Usually, water is utilized as intermediate medium to carry the released heat out of the space.

The ICT and/or telecom equipment is usually placed in a system cabinet. Known system cabinets can be cooled in a vertical manner or in a horizontal manner. With cooling in a vertical manner, cold air flow is blown into the system cabinet at the bottom thereof and then, by fans, transported upwards, along the way cooling the equipment. A disadvantage is that the cold air stream heats up gradually, so that the air stream in the upper region of the system cabinet is warmer than the air stream in the lower region of the system cabinet. Due to this gradual heat-up of the air stream in the system cabinet for cooling the equipment, only a limited amount of equipment can be placed in the system cabinet, so that not the whole system cabinet can be utilized.

With cooling in a horizontal manner, the cooled air stream is passed horizontally through the equipment arranged in the system cabinet, by means of fans of the ICT and/or telecom equipment. The heated air stream leaves the system cabinet at the back. A disadvantage is that the heated air stream of one system cabinet can mix with the cooled air stream of another system cabinet. Another disadvantage of horizontal cooling is that cooled air flow can mix with heated air without cooling any equipment.

Cooling through recirculation air an air humidity- and temperature-conditioned space in a data center in which ICT and/or telecom equipment is arranged, is not done efficiently in the known manner. Usually, the air stream is cooled to a temperature that is considerably lower than the operating temperature. Furthermore, use is made of relatively complex cooling units, and cooling involves much loss. As a consequence, much energy is required and the electricity costs of a data center are high. Especially in the case of a large data center, the costs of energy consumption consequently account for a considerable part of the total operational costs of the data center. Since the refrigerant is typically a propellant, in case of leakage of the refrigerant from the cooling unit, propellant may end up in the atmosphere, causing an environmental impact. Moreover, as a consequence of the use of water to dissipate the released heat from the space, water conduits are present in the space. These might start to leak and then constitute a danger to the ICT and/or telecom equipment arranged in the space.

The object of the invention is to provide an apparatus of the type mentioned in the opening paragraph hereof which, while maintaining the above-mentioned advantages, can obviate the above-mentioned disadvantages.

SUMMARY

A first aspect of the invention is a data center comprising an air humidity- and temperature-conditioned space where heat producing ICT and/or telecom equipment is arranged, a heat wheel and means for supplying recirculation of air heated by the equipment as a first air stream to the heat wheel and the heat wheel being configured to cool the first air stream using a separate second air stream.

The claimed invention is based on the insight that for cooling recirculation air in a data center, it is specifically a heat wheel, i.e. an air-to-air heat exchanger of the rotary type, that can be employed successfully. Precisely with the heat wheel, a sufficiently large cooling capacity can be realized for a data center, while any leakage surprisingly does not present any problems for such an application.

Use of a heat wheel minimizes or eliminates use of complex cooling units with refrigerant and any intermediate medium, so that cooling is done more efficiently. This can yield a considerable saving of energy and hence of costs. Also, the environmental impact is reduced, because less energy is needed.

Since the use of refrigerant is minimized or eliminated, the environmental impact—resulting from leaking propellant—is also reduced.

An advantage of the heat wheel as a heat exchange body is the efficient manner of heat transfer from the first air stream to the second air stream. Moreover, moisture transport between the first and the second air stream can be minimal, so that the air humidity of the first air stream remains approximately equal. For the practically continuous cooling of the recirculation air in the space in the data center, a heat wheel can be utilized in a particularly efficient manner. Further, the temperature of the cooled first air stream can be approximately equal to the operating temperature. In a region with a comparable type of climate to the Netherlands, and when using outside air flow as a second air stream, the heat wheel, at non-stop operation, can be used for nearly 80% of the time.

Only for the residual 20% may the outside air stream be too warm and may limited additional cooling be needed supplemental to the cooling with the heat wheel. It is noted that within this context a heat wheel is understood to mean an air-to-air heat exchanger provided with a rotatably arranged, plate-shaped heat exchange body. The heat exchange body is preferably substantially of metal. The heat exchange body then extends preferably through a partition between two air chambers through which the first and second air stream, respectively, are guided. The heat exchange body is preferably disc-shaped and may optionally be provided with perforations. Elegantly, the heat exchange body may be disposed horizontally. What can thus be achieved is that the dimensions of the heat exchange body require no greater construction height than the height of a conventional story.

A large cooling capacity can for instance be achieved by making the heat wheel of large design or by using a plurality of smaller heat wheels. The rotary speed of a large heat wheel can be kept low for a considerable part of the time while yet sufficient cooling capacity can be achieved and leakage can be limited.

Preferably, the first air stream cooled by the air-to-air heat exchanger is supplied to the equipment separately from the air stream heated by the equipment. This prevents the heated first air stream from mixing with the cooling air, so that the temperature of the air stream cooled by the air-to-air heat exchanger can be approximately equal to the desired operating temperature. This yields a further saving of energy and hence of costs.

In another advantageous embodiment, the second air stream is supplied from outside the conditioned space. This can for instance be air from another space in the data center, or outside air. By making use, for instance, of outside air, the recirculation air can be cooled in an advantageous manner.

The invention further relates to a method for cooling by means of recirculation air an air humidity- and temperature-conditioned space in a data center in which ICT and/or telecom equipment is arranged, and to the use of a heat wheel, for cooling a recirculation air of an air humidity- and temperature-conditioned space of a data center in which ICT and/or telecom equipment is arranged.

Further advantageous embodiments of the invention are represented in the claims. The invention will be elucidated with reference to an exemplary embodiment represented in the drawings.

DETAILED DESCRIPTION

Figure 1:
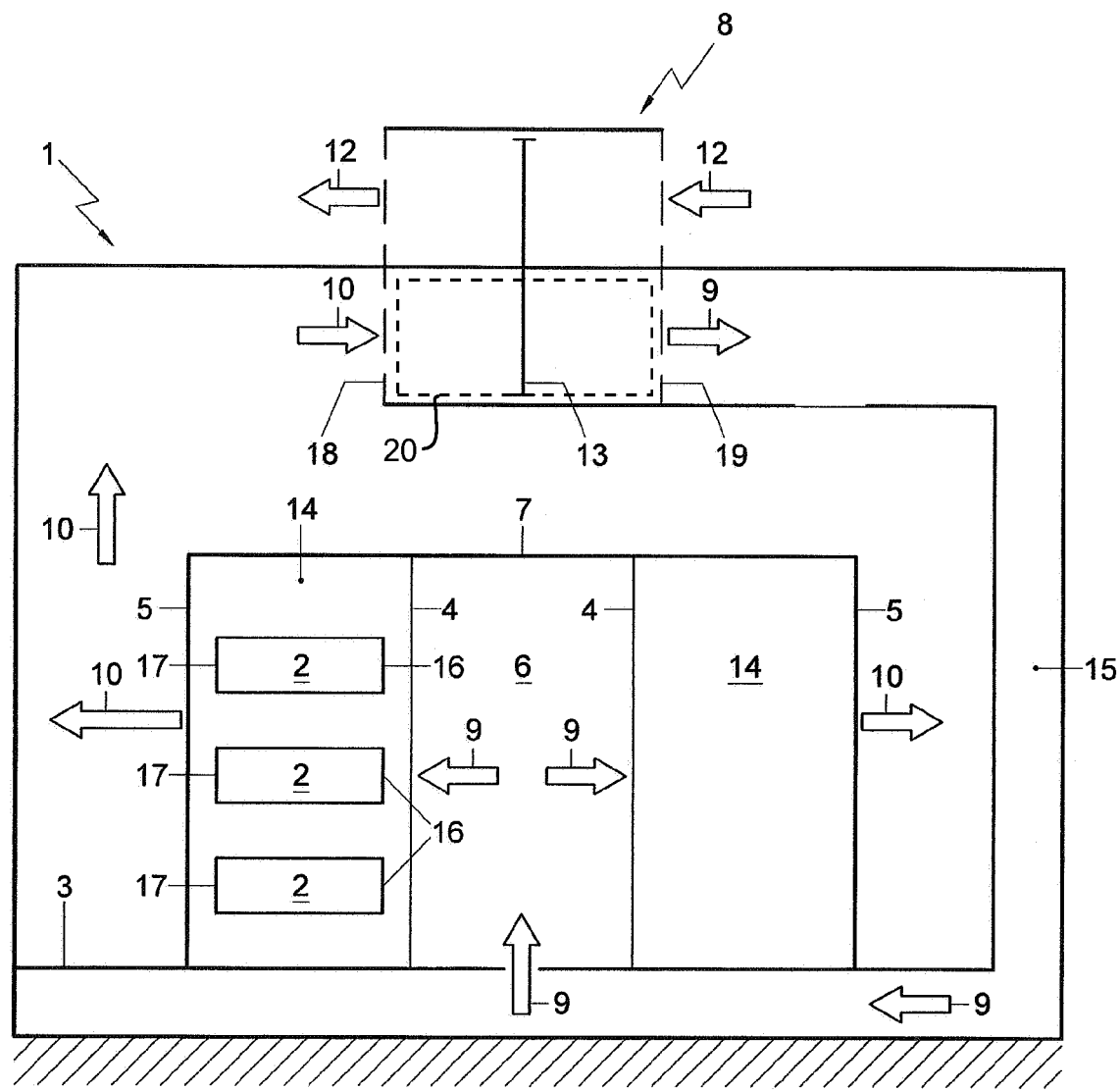
FIG. 1 shows a schematic view of a space with equipment.

It is noted that the figures are only schematic representations of a preferred embodiment of the invention that is described by way of a non limiting exemplary embodiment. In the figures, like or corresponding parts are designated with the same reference numerals.

In FIG. 1 a conditioned space 1 in a data center is shown. In the space 1, a stable temperature and air humidity prevail. Preferably, the air humidity is between 45% and 55%. In the space 1, ICT and/or telecom equipment 2 is arranged. The equipment 2 produces heat and is therefore cooled using an air stream that recirculates in the space 1. Preferably, the operating temperature of the equipment is between 20° C. and 25° C. For the purpose of the air recirculation and the cooling, the space 1 is provided with a raised floor 3.

The equipment 2 comprises for instance computer, network or server equipment and is preferably arranged in a system cabinet 14. In this exemplary embodiment, system cabinets 14 are provided with a front 4 to which a cooled first air stream is supplied and a back 5 along which a heated first air stream is removed. The equipment 2 has a front 16 facing the front 4 of the system cabinet 14, and a back 17 facing the back 5 of the system cabinet 14.

To prevent heated air flow from mixing with the cooled first air stream, the system cabinets 14 have their fronts 4 facing each other, to thereby form a 'cold corridor' 6. In this exemplary embodiment, the cold corridor 6 is closed off with sidewalls and a ceiling 7, to thereby create a closed space within the space 1, and to separate the heated first air completely from the cooled first air stream. The heated first air is cooled by means of a cooling device 8, and the cooled first air stream is thereupon blown under the raised floor 3.

The recirculation of the first air stream in the space 1 proceeds as follows. A cooled first air stream 9 is blown under the raised floor 3. Adjacent the fronts 4 of the system cabinets 14, there are apertures in the floor through which the cooled first air stream 9 is blown. The cooled first air stream 9 is supplied to the fronts 4 of the system cabinets 14 and in them is drawn to the back 5 by the fans of the equipment 2 arranged in the system cabinets 14. On the way, the equipment 2 is cooled, as a result of which the cooled first air stream heats up, and the first air stream exits at the back 5 from the system cabinets 14 as a heated first air stream 10. Upon passing through the system cabinet 14, the cooled first air stream 9 will have heated up by some 6 to 12° C., on average, thereby rendered a heated first air stream 10. The heated first air stream 10 is outside the cold corridor 6 and cannot mix with the cooled first air stream 9 because of the ceiling 7. As a consequence, no losses occur and the cooled first air stream 9 can be presented to the equipment 2 at the operating temperature of the equipment 2, between 20° C. and 25° C. The cooled first air stream 9 exiting from an exit opening 19 of the cooling device 8 is thus supplied separately via a supply duct 15 to the front 16 of the equipment 2. The heated first air stream 10 is removed from the space 1 near the ceiling via a discharge duct, not shown, and is supplied to an inlet opening 18 of the cooling device. The first air stream thus recirculates in the space 1, while in this exemplary embodiment the cooled first air stream 9 is separated from the heated first air stream 10.

The cooling device 8 is designed as an air-to-air heat exchanger 8 designed as a heat wheel, to which the heated first air stream 10 is supplied. In the air-to-air heat exchanger 8, the heated first air stream 10 is cooled using a separate second air stream 12. Preferably, as shown in FIG. 1, the second air stream 12 is supplied from outside the space 1. In an advantageous embodiment, the second air stream 12 is outside air. In the air-to-air heat exchanger 8, the first air stream 10 and the second air stream 12 remain separate from each other, and therefore no mixing or substantially no mixing of first and second air stream takes place.

Figure 2:
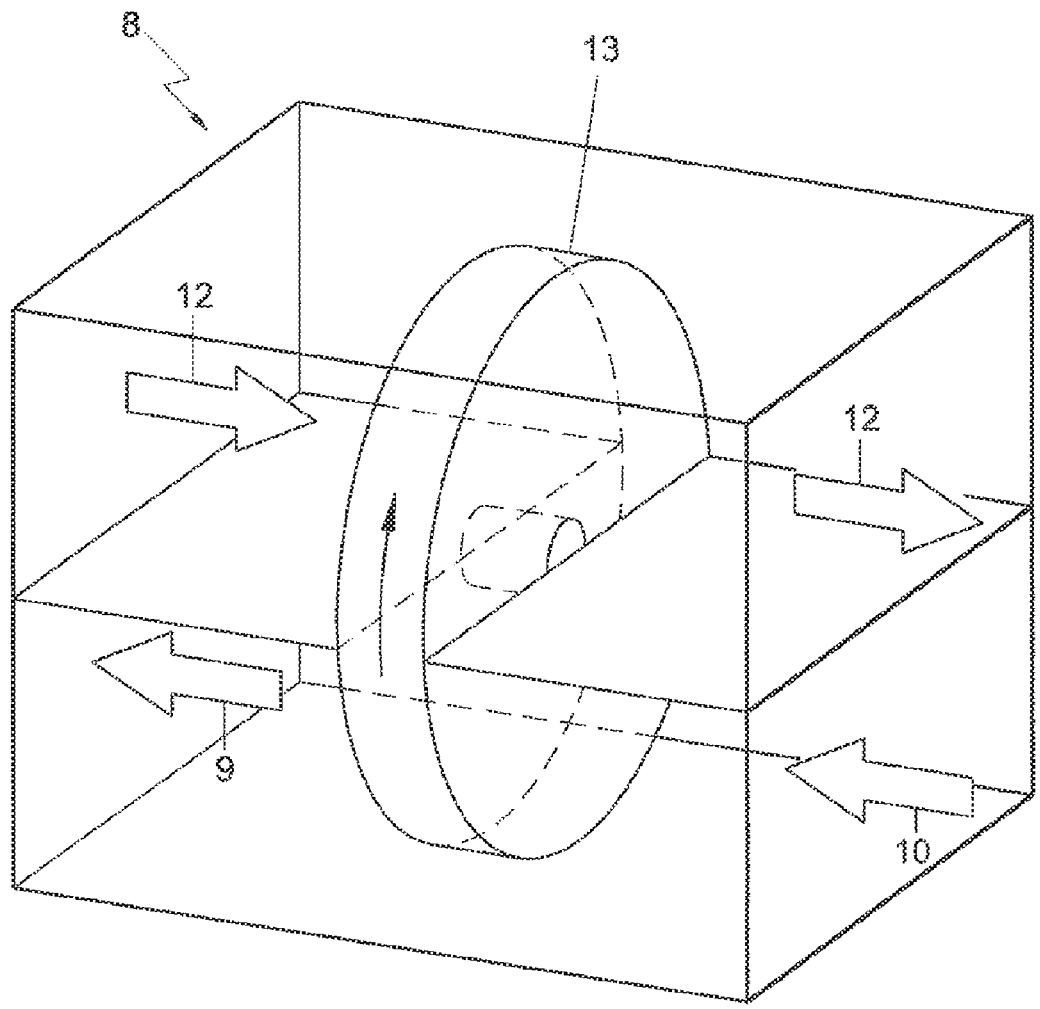
FIG. 2 shows a schematic view of an air-to-air heat exchanger designed as a heat wheel.

FIG. 2 shows a schematic view of an air-to-air heat exchanger 8. The air-to-air heat exchanger 8 is provided with a plate-shaped heat exchange body 13, for instance a substantially metallic plate with small apertures through which air can move. The plate can have any shape, but is preferably rectangular or circular. The heat exchange body 13 may also be designed as a plate-shaped disc wound from corrugated metal plate.

The heat exchange body 13 is rotatably arranged and moves successively through the heated first air stream 10 and the cooler second air stream 12. The heat exchange body 13 extends through a partition between two air chambers through which the first air stream 9, 10, and the second air stream 12, respectively, are guided. Optionally, brushes may be provided, which prevent air being passed through the partition along with the heat wheel, so that leakage can be limited. If desired, optionally, a mixing chamber may be provided in the partition between the air chambers, to prevent unwanted exchange between the air streams, such as for instance moisture entry or moisture loss.

When the heat exchange body 13 moves through the heated first air stream 10, the heat exchange body 13 is heated up and the heated first air stream 10 cools down to a cooled first air stream. Next, the heated heat exchange body 13 moves through the cool incoming second air stream 12, as a result of which the second air stream 12 is heated up to a warm exiting second air stream and the heat exchange body 13 cools down.

In a heat wheel, the heat exchange body 13 is designed as a circular thin metal wheel with small apertures through which air can move. An advantage of the heat wheel is that moisture transfer between the first and second air stream can be minimal, so that the air humidity of the first air stream 9, and hence the air humidity in the space 1, remains substantially unchanged. The construction of the heat wheel will not be discussed in more detail here, since it is well known to those skilled in the art. An example of the construction of a heat wheel is described in the publication 'Hoval Rotary Heat Exchanger for Heat Recovery in Ventilation Systems' HW 60aE1 11/2002 as available on www.hoval.com of Hovalwerk AG, in particular on page 8 of the publication.

If the second air stream 12 is a stream of outside air, it can for instance be used up to an inlet temperature of 18° C. for complete cooling of the heated first air stream to 22° C. Since the equipment in the space in the data center needs to be cooled substantially continuously, and since the outside air temperature including nights in countries of a climate type like the Netherlands is lower than 18° C. for an average 80% of the time, the heat wheel can be deployed for cooling the data center for as much as 80% of the time without additional cooling. For the residual 20% of the time, the temperature of the outside air stream will often be such that additional cooling is needed. Additional cooling can be realized with any other type of cooling device 20. In an environmentally friendly manner, additional cooling can for instance be carried out by means of soil storage, whereby air is drawn from a cool underground buffer space.

Since a cooling device 8 for cooling the first air stream in a conditioned space 1 in a data center is needed virtually continuously—24 hours a day, seven days a week—the use of an air-to-air heat exchanger, and in particular of a heat wheel, is extremely efficient, as no refrigerant and cooling liquid are used. Thus, a considerable saving on energy consumption and hence on electricity costs can be achieved. Also, there is less environmental impact owing to the absence of an environmentally unsound refrigerant and owing to the lower energy consumption.

As long as a cooling demand is substantially unchanged—for instance in that the same amount of equipment 2 in the space remains active—and the temperature of the second air stream 12 is practically unchanged, a flow rate of the first air stream 9 and the second air stream 12 will likewise remain substantially unchanged, since the cooling demand depends on the amount of heat being produced by the equipment 2. Upon a change of the cooling demand, for instance in that more or less equipment 2 in the space 1 is active, the flow rate of the first air stream 9, 10 can be changed. If the temperature of the incoming second air stream 12 changes, for instance due to the surroundings becoming hotter or colder, also the flow rate of the second air stream 12 can be adjusted. As the flow rate of the second air stream 12 can be adjusted, it can be ensured that the temperature of the cooled first air stream 9 remains substantially unchanged. So, the flow rate of the second air stream 12 depends on the difference in temperature between the second air stream 12 and the first air stream 10. The flow rate can then be controlled depending on the desired temperature of the cooled first air stream, for instance 22° C. The flow rate can for instance be controlled by adjusting the rotary speed of the heat wheel. In a type of climate as in the Netherlands, the rotary speed can be low for a large part of the time.

Figure 3:
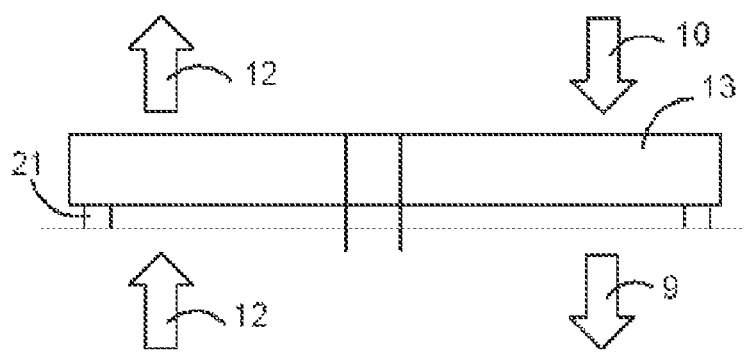
FIG. 3 shows a schematic view of a horizontally configured heat wheel.

As illustrated in FIG. 3 the heat wheel 13 may be arranged horizontally. When so arranged it may optionally be supported to prevent bending, for instance using support rollers 21 (which are not intended to be shown in any specific location relative to the heat wheel 13).

It will be clear that the invention is not limited to the exemplary embodiments represented here. For instance, the cooling device may be disposed inside the space or outside it, or—as shown in FIG. 1—partly inside the space and partly outside. Also, the cooling device may be disposed outside the data center. If the cooling device is disposed outside the space, the heated first air stream will for instance be carried to the air-to-air heat exchanger via a ceiling of the space. The additional cooling by the cooling device 20 can be done in various ways, for instance by adiabatic cooling or by means of a conventional liquid cooling. Such variants will be clear to those skilled in the art and are understood to be within the scope of the invention as set forth in the appended claims.

While the invention has been particularly shown and described with reference to a number of embodiments, it would be understood by those skilled in the art that changes in the form and details may be made to the various embodiments disclosed herein without departing from the spirit and scope of the invention and that the various embodiments disclosed herein are not intended to act as limitations on the scope of the claims. All references cited herein are incorporated in their entirety by reference.

What is claimed is:

1. A data center, comprising:
    an air humidity- and temperature-conditioned space in a building where heat producing ICT and/or telecom equipment is arranged, the ICT and/or telecom equipment having an operating temperature;
    a primary data center cooling means, the primary data center cooling means comprising a substantially sensible only heat exchange heat wheel cooling a first re-circulated air stream heated by the equipment to a cooling temperature at or below the operating temperature using a second separate airstream at a temperature less than or equal to the cooling temperature minus a predetermined temperature difference without any additional cooling device, the primary data center cooling means comprising no refrigerant or liquid-based cooling; and
    a secondary data center cooling means supplementing the primary data center cooling means when the second air stream is at a temperature greater than the cooling temperature minus the predetermined temperature difference to cool the first re-circulated air stream to the cooling temperature,
    wherein the primary data center cooling means is configured to cool the first re-circulated air stream to the cooling temperature without any additional cooling device whenever the second air stream temperature is less than or equal to the cooling temperature minus the predetermined temperature difference.

2. The data center of claim 1, further comprising means supplying the first re-circulated air stream cooled by the heat wheel to the equipment separately from the first re-circulated air stream heated by the equipment.

3. The data center of claim 1, wherein the second air stream is supplied from outside the conditioned space.

4. The data center of claim 1, wherein the second air stream is outside air.

5. The data center of claim 1, wherein the heat wheel is arranged outside the conditioned space.

6. The data center of claim 1, wherein the heat wheel is arranged outside the data center.

7. The data center of claim 1, wherein the heat wheel comprises a plate-shaped heat exchange body which moves successively through the first re-circulated air stream and the second air stream.

8. The data center of claim 7, wherein the heat wheel extends through a partition between two chambers, through which chambers the first re-circulated and the second air stream, respectively, are guided.

9. The data center of claim 1, wherein a flow rate of the first re-circulated air stream is adjustable.

10. The data center of claim 1, wherein the cooling temperature is greater than or equal to 20° C.

11. The data center of claim 1, wherein the heat wheel is configured to rotate horizontally.

12. The data center of claim 11, further comprising rollers operatively associated with the heat wheel to support it in its horizontal configuration.

13. The data center of claim 1, wherein the cooled first re-circulated airstream is supplied at a front of the equipment and the heated first re-circulated airstream is removed at a back of the equipment.

14. The data center of claim 1 further comprising an exit opening operatively associated with the heat wheel and a supply duct connected thereto which supplies the cooled first re-circulated air stream as a separate air stream to a front of the equipment to be cooled.

15. The data center of claim 1 further comprising an inlet opening operatively associated with the heat wheel receiving the heated first re-circulated air stream from the space to be cooled.

16. The data center of claim 1 wherein the predetermined temperature difference is about 4° C.

17. The data center of claim 1 wherein the operating temperature is in a range of 20-25° C.

18. The data center of claim 1 wherein the select temperature of the second air stream is less than or equal to about 18° C.

19. The data center of claim 1 wherein the cooling temperature is approximately equal to the operating temperature.

20. The data center of claim 1 wherein a difference in temperature between the first re-circulated airstream heated by the equipment and the cooling temperature is about 6-12° C.

21. The data center of claim 1 wherein the heat wheel is constructed from a thermally conductive plate of material having a plurality of apertures disposed therethrough.

22. The data center of claim 21 wherein the thermally conductive plate of material is metallic.

23. The data center of claim 1 wherein the there is substantially no exchange of moisture between the first re-circulated air stream and the second air stream.

24. The data center of claim 1 wherein the humidity of the first re-circulated airstream remains substantially unchanged.

25. The data center of claim 1 wherein the secondary data center cooling means comprises at least one of soil storage, adiabatic or liquid cooling.

26. The data center of claim 1 wherein the flow rate of the second air stream is adjustable.

27. The data center of claim 1 wherein the rotary speed of the heat wheel is adjustable.

28. A method of cooling a data center, comprising:
providing an air humidity- and temperature-conditioned space in a building where heat producing ICT and/or telecom equipment is arranged, the ICT and/or telecom equipment having an operating temperature;
providing a primary data center cooling means, the primary data center cooling means comprising a substantially sensible only heat exchange heat wheel and no refrigerant or liquid-based cooling;
supplying a first re-circulated air stream from the humidity- and temperature-conditioned space heated by the equipment to the heat wheel;
supplying a second separate airstream at or below a select temperature to the heat wheel, the select temperature being selected so that the first air stream is cooled to a cooling temperature at or below the operating temperature by the heat wheel without any additional cooling device, the select temperature being less than or equal to the cooling temperature less a predetermined temperature difference;
rotating the heat wheel so that it moves successively through the first and second air stream;
providing a secondary data center cooling means;
using the secondary data center cooling means, supplementing the primary data center cooling means when the second air stream is at a temperature above the select temperature to cool the first re-circulated air stream to the cooling temperature; and
providing the first airstream cooled to the cooling temperature to the air humidity- and temperature-conditioned space,
wherein the primary data center cooling means cools the first re-circulated air stream without any additional cooling device whenever the second air stream temperature is less than the select temperature.

29. The method of claim 28 further comprising changing a flow rate of the first re-circulated air stream when adding or removing of ICT and/or telecom equipment from the conditioned space.

30. The method of claim 29 further comprising changing at least one of a second air stream flow rate or a rotary speed of the heat wheel in order to cool the first re-circulated air stream to the cooling temperature.

31. The method of claim 28 further comprising adjusting a flow rate of the second air stream as the temperature of the second air stream changes.

32. The method of claim 28 further comprising changing a rotary speed of the heat wheel in order to cool the first re-circulated air stream to the cooling temperature.

33. The method of claim 28 further comprising separating the cooled first re-circulated airstream from the heated first re-circulated airstream.

* * * * *

UNITED STATES PATENT AND TRADEMARK OFFICE
CERTIFICATE OF CORRECTION

PATENT NO. : 7,753,766 B2  Page 1 of 1
APPLICATION NO. : 12/124697
DATED : July 13, 2010
INVENTOR(S) : Pedro Matser et al.

It is certified that error appears in the above-identified patent and that said Letters Patent is hereby corrected as shown below:

On the face of the patent, should read:

(12)  United States Patent
      Matser et al.

(75)  Pedro Matser

(30)  Foreign Application Priority Data
      September 6, 2006  (NL)  1032450

Signed and Sealed this

Seventh Day of September, 2010

David J. Kappos
*Director of the United States Patent and Trademark Office*